Figure 1:
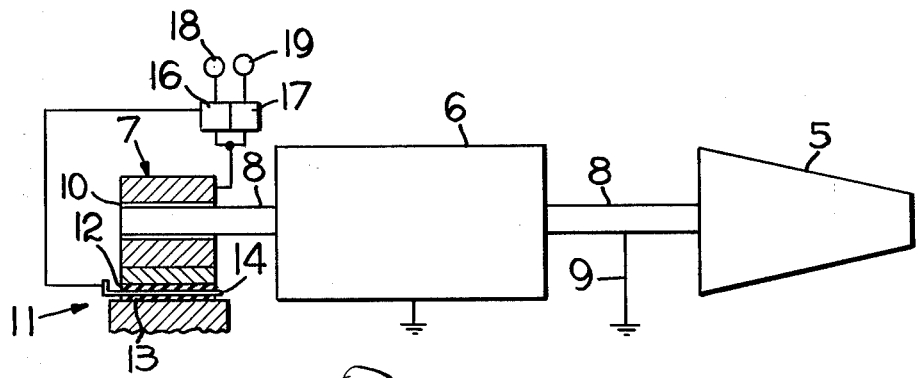

United States Patent [19]

Burrus, Jr.

[11] 4,097,794
[45] Jun. 27, 1978

[54] STATIC MEANS FOR DETECTING GROUND INSULATION FAILURE FOR ROTARY ELECTRIC MACHINES

[75] Inventor: Joe H. Burrus, Jr., Brookfield, Wis.

[73] Assignee: Allis-Chalmers Corporation, Milwaukee, Wis.

[21] Appl. No.: 742,358

[22] Filed: Nov. 15, 1976

[51] Int. Cl.² .................. G01R 31/02; G01R 31/12
[52] U.S. Cl. .................................................. 324/54
[58] Field of Search ................. 324/54, 51, 158 MG; 340/269; 318/490; 322/99

[56] References Cited
U.S. PATENT DOCUMENTS

| 2,146,069 | 2/1939 | Higgins | 324/54 |
| 2,679,026 | 5/1954 | Frakes | 324/54 |
| 3,769,578 | 10/1973 | Staley | 324/54 |
| 3,904,940 | 9/1975 | Burrus | 324/54 X |

FOREIGN PATENT DOCUMENTS

| 1,199,876 | 9/1965 | Germany | 324/54 |
| 2,240,221 | 1/1974 | Germany | 324/54 |

Primary Examiner—Gerard R. Strecker
Attorney, Agent, or Firm—Robert C. Jones

[57] ABSTRACT

Electrical potentials are induced in the rotating shaft of many rotary electrical machines because of stray flux that exists in the machines. Unless provided with adequate ground insulation to interrupt the circuit, currents can flow through the machine bearings and other parts to ground and thereby expose the machine to severe damage. The device of this invention provides a sandwich-like ground insulation with a conductor therebetween and measures the voltage across that portion of the insulation between the conductor and either the bearing housing or ground to indicate if there is a circuit for excessive current leakage from the bearing to ground.

2 Claims, 2 Drawing Figures

STATIC MEANS FOR DETECTING GROUND INSULATION FAILURE FOR ROTARY ELECTRIC MACHINES

This invention pertains in general to rotary electrical machines and more particularly to a device for detecting a failure of insulation provided to interrupt the circuit between the machine bearing and electrical ground.

In many large rotating electrical machines such as, for instance, steam turbine-generators, the machine bearing is mounted in a pedestal separated from the main generator housing or in a bracket as part of the generator end cover. Because of stray flux existing in the generator, a voltage is induced in the generator shaft as it rotates. Although the oil film which exists between the shaft and the bearing and between other parts of the machine does offer an insulating effect to this voltage, the low insulating value of an oil film does not offer adequate protection. If the bearing housing were grounded, the current flowing therethrough would damage the bearing, requiring premature replacement thereof. Since replacement of bearings on this type of machine can result in considerable expense to the owner, it is extremely important to properly insulate the bearing housing from electrical ground.

Not only is a proper ground insulation necessary, but procedures must be employed to insure that the insulation does not deteriorate. In most instances, a periodic reading is taken across the bearing housing and ground to insure that the insulation is satisfactory. Voltage sensing devices are not permanently connected across the bearing housing and ground because these devices may short and nullify the insulation thereby causing damage to the bearings.

Applicant has invented a device for measuring the voltage drop across the oil film which does not provide a possible shorted current path around the ground insulation. Such device is the subject of U.S. Pat. No. 3,904,940 issued Sept. 9, 1975. The patented device does however include a brush in contact with the machine rotating shaft which is subject to wear whereas the device of the subject invention has no wearing parts.

It is therefore the intention and general object of this invention to provide a means for detecting deterioration of the bearing ground insulation on rotary electrical machines without providing a path for current flow around the complete insulation to ground which does not have any parts subject to wear.

Another object of the subject invention is to provide a device for detecting deterioration of the bearing ground insulation on rotary electrical machines wherein a voltage sensing means is provided across the bearing housing and a conductor dividing the ground insulation.

A more specific object of the subject invention is to provide a device of the hereinbefore described type wherein alarm indicating means are connected to the voltage sensing means to indicate when the ground insulation is deteriorating.

Figure 2:
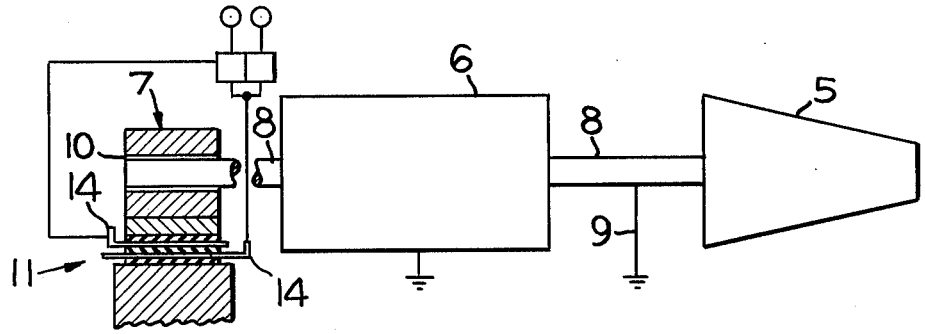

These and other objects of the subject invention will become more fully apparent as the following description is read in light of the attached drawing wherein:

FIG. 1 shows a rotary electrical machine with one embodiment of the invention disclosed herein; and FIG. 2 shows a different embodiment of the invention.

Referring to the attached drawing, the invention shown herein for purposes of illustration is a steam turbine-generator with the turbine indicated at 5, the generator at 6, and the outboard bearing housing at 7. Due to stray flux existing in the generator 6, a voltage is induced in the shaft 8. The discharge circuit for this voltage is shaft 8 through inboard bearings or grounding brush 9, through bearing insulation 11 to bearing housing 7, through oil film 10 to shaft 8. The oil film 10 and bearing insulation 11 act as electrical capacitors in the circuit, limiting the flow of current to a few micro amperes. If the outboard bearing housing 7 is not insulated from ground, there would be sufficient current flow therethrough to seriously damage the bearings and cause premature replacement thereof.

Since the cost of the bearings, the cost of replacement and the downtime of the generator can be extremely costly to the generator owner, it is important to insure that the ground insulation 11 does not deteriorate to the extent that increased current will flow and damage the bearings. It is possible to provide a voltage or current sensing means across the bearing housing 7 and ground which would warn the operator when the ground insulation was deteriorating to a dangerous level. However, since any instrument is subject to failure, the sensing device could, if defective, provide a direct short to ground through the bearing and thereby do more damage to the bearing than would a deteriorating ground insulation. For this reason sensing devices have not been extensively utilized at this location.

The device of this invention is an extremely uncomplicated means of determining when the ground insulation begins to deteriorate. Furthermore, this device does not provide a potential direct short between the bearing housing and ground.

The oil film and the bearing housing to ground insulation act as two electrical capacitors in series. A voltage can be measured across the oil film between the shaft and the bearing pads 12 as disclosed in U.S. Pat. No. 3,904,940 or across the ground insulation 11 between the bearing housing 7 and electrical ground. However, as previously noted, if the voltage is measured completely across the ground insulation a potential short circuit path exists. Therefore, as shown in FIG. 1, applicant has divided the insulation 11 into two parts 12 and 13 by inserting a conductor 14 therebetween. With this arrangement, there are three effective capacitors in series: the oil film, the insulation 12 and the insulation 13.

The amount of the voltage from shaft to ground varies, depending on the character of the particular machine involved. Generally, the sum of these three voltages may be as little as 4 volts or as high as 30 volts. As an example in a particular machine, there may be a total of 10 volts between the shaft 8 and the electrical ground. This voltage is divided between the oil film and the ground insulation. As an example, there may be 2 volts across the oil film and 4 volts across each portion 12 and 13 of the ground insulation 11. Since the total voltage from the shaft to ground remains substantially constant, any change in the voltage across the ground insulation, due to high resistance shorts, would result in a change in the voltage across the ground insulation portion 12. That is, if the voltage in the above example across the ground insulation portion 13 changed from 4 to 2, there would be an increase in the voltage across the oil film and the insulation portion 12. By sensing the change in the voltage across the ground insulation portion 12, it is possible to immediately determine that there has been a change in the insulating effect of the ground insulation portion 12 or the oil film 10.

With this in mind, and as shown in FIG. 1, applicant provides a voltage sensing means across the insulation portion 12 between the bearing housing 7 and the conductor 14. This voltage sensing means may be an electronic voltage sensing device which emits a signal upon change of voltage from a preset amount. As an example, two voltage sensing means 16 and 17 may be provided across the insulation portion 12. Each voltage sensing means is adjustable to a preset voltage within the range to be measured. Each voltage sensing means is also provided with a warning device such as a light 18 and 19.

The warning device of the subject invention would be installed and operated as follows. It would first be necessary to insure that the machine was operating satisfactorily and that the ground insulation portions 12 and 13 and oil film 10 were adequate. For ease of illustration, assume that there is a 10-volt potential from the shaft 8 to ground across the bearing housing 7. Assume further that the voltage across the oil film is 2 volts. It would then be known that the voltage across the ground insulation 11 is 8 volts and assume further that this voltage drop is divided equally at 4 volts each across the insulation portions 12 and 13. The voltage sensing device 16 would then be set at, for instance, 3 volts, and the sensing device 17 would be set at, for instance, 5 volts.

Under normal operating conditions, the voltage across the insulation portion 12 would be approximately 4 volts and neither warning light would flash. However, if the voltage increased to 5 volts, this would indicate a decrease in voltage across either the ground insulation portion 13 or the oil film and an increase in current. Since the voltage sensing device 17 was set to emit a signal if the voltage increased beyond 5 volts, the warning light 19 would flash, indicating to the operator the possibility that the ground insulation portion 13 had deteriorated to a dangerous level and should be inspected. On the other hand, if the voltage across the insulation portion 12 decreased, it would indicate that this insulation was deteriorating and the warning light 18 would indicate this condition.

FIG. 2 shows a modification which divides the insulation into three portions by utilizing two conductors 14. The voltage drop is then measured across the insulation portion that is between the conductors. Either embodiment will provide adequate warning. The physical arrangement of the machine may determine which embodiment is selected.

From the above description, it can be seen that a very uncomplicated device has been disclosed which will adequately indicate when the ground insulation is deteriorating or when there is an insufficient film. Furthermore, this device does not utilize any parts which are subject to wear. Additionally, this device is not placed in a position where, if it were to fail, it would provide a direct short between the bearing and ground which would result in damage to the bearing.

The embodiment of the invention in which an exclusive property or privilege is claimed are defined as follows:

1. In combination with a dynamoelectric machine having an electrically grounded rotating shaft with electrical potential generated therein, a bearing rotatably supporting said shaft on a film of oil, said oil providing electrical insulation between said shaft and said bearing sufficient to cause a voltage potential across said oil film and electrical insulation isolating said bearing from electrical ground said insulation being dividing into at least two insulation portions by an electrical conductor, a device for detecting electrical potential from said bearing to said ground which avoids providing a path for current flow around the complete insulation to ground and is not subject to wear comprising a voltage sensing means connected across said conductor and said bearing, said voltage sensing means indicating a change in voltage when there is a condition exposing the unit to an increase in current flow from said bearing to said ground.

2. The combination as set forth in claim 1 wherein said electrical insulation is divided into three insulation portions by two electrical conductors and said voltage sensing means is connected across said conductors.

* * * * *